(12) United States Patent
Komatsu et al.

(10) Patent No.: US 6,960,959 B2
(45) Date of Patent: Nov. 1, 2005

(54) POWER AMPLIFIER AND COMMUNICATION APPARATUS

(75) Inventors: Naoki Komatsu, Osaka (JP); Toru Matsuura, Osaka (JP); Hiroshi Isono, Kanagawa (JP); Kaoru Ishida, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 35 days.

(21) Appl. No.: 10/450,634

(22) PCT Filed: Dec. 13, 2001

(86) PCT No.: PCT/JP01/10929

§ 371 (c)(1),
(2), (4) Date: Nov. 7, 2003

(87) PCT Pub. No.: WO02/49209

PCT Pub. Date: Jun. 20, 2002

(65) Prior Publication Data

US 2004/0075503 A1 Apr. 22, 2004

(30) Foreign Application Priority Data

Dec. 15, 2000 (JP) .................................... 2000-382743

(51) Int. Cl.[7] ............................................... H03F 3/68
(52) U.S. Cl. .................... 330/295; 330/51; 330/124 R
(58) Field of Search .................. 330/295, 51, 124 R

(56) References Cited

U.S. PATENT DOCUMENTS

| | | | |
|---|---|---|---|
| 4,910,478 A | | 3/1990 | Koyama |
| 5,287,543 A | * | 2/1994 | Wolkstein ................ 455/13.3 |
| 5,786,727 A | * | 7/1998 | Sigmon ................... 330/124 R |
| 5,909,643 A | | 6/1999 | Aihara |
| 5,973,557 A | * | 10/1999 | Miyaji et al. ................. 330/51 |
| 6,043,721 A | * | 3/2000 | Nagode et al. ............. 332/117 |
| 6,114,911 A | | 9/2000 | Iwai et al. | |

FOREIGN PATENT DOCUMENTS

| | | |
|---|---|---|
| EP | 0 837 559 A | 4/1998 |
| EP | 1 032 120 A | 8/2000 |
| JP | 54-084459 A | 7/1979 |
| JP | 1-311707 | 12/1989 |
| JP | 5-259765 | 10/1993 |
| JP | 06-053753 | 2/1994 |
| JP | 10-126164 | 5/1998 |
| JP | 10-190379 | 7/1998 |
| JP | 11-145748 | 5/1999 |
| JP | 2000-013163 | 1/2000 |

OTHER PUBLICATIONS

European Search Report for EP 01 27 0951, dated Nov. 2, 2004.

* cited by examiner

*Primary Examiner*—Patricia Nguyen
(74) *Attorney, Agent, or Firm*—RatnerPrestia

(57) ABSTRACT

A power amplifier of amplifying signals of two frequency bands is reduced in size and improved in efficiency at low output.

The power amplifier includes an input terminal, a branch circuit and so on having one input and a plurality of outputs, the input being connected to the input terminal, amplifying means which are connected to some outputs of the branch circuit and so on and are operated at different signal frequencies from each other, a transmission line connected to one of the other outputs of the branch circuit, a synthesizing circuit connected to the outputs of the amplifying means and the output from the transmission line, a switch provided between the transmission line and a synthesis output unit, and a control circuit of controlling conduction of the branch circuit and so on, conduction and an amplifying operation of the amplifying means, and conduction of the switch.

14 Claims, 7 Drawing Sheets ical Field

The present invention relates to a power amplifier and a communication apparatus used for mobile communication.

BACKGROUND ART

Mobile communication applications have used a variety of frequency bands, and it has been desirable to handle a plurality of applications in radios. Some applications, typified by CDMA, require control of output power, particularly lower power consumption, over a wide dynamic range. Further, smaller radios reduced in weight have been also desired.

A conventional power amplifier will be discussed below in accordance with accompanying drawings.

FIG. 7 is a block diagram showing a conventional power amplifier 700. In FIG. 7, reference numeral 701 denotes a first input terminal, reference numeral 702 denotes a first input-side matching circuit, reference numeral 703 denotes a first input-side DC bias supply circuit, reference numeral 704 denotes a first transistor, reference numeral 705 denotes a first output-side DC bias supply circuit, reference numeral 706 denotes a first output-side matching circuit, reference numeral 707 denotes a first output terminal, reference numeral 708 denotes a second input terminal, reference numeral 709 denotes a second input-side matching circuit, reference numeral 710 denotes a second input-side DC bias supply circuit, reference numeral 711 denotes a second transistor, reference numeral 712 denotes a second output-side DC bias supply circuit, reference numeral 713 denotes a second output-side matching circuit, and reference numeral 714 denotes a second output terminal.

The conventional power amplifier configured in this way performs operations on signals of two kinds of frequencies. The operation is performed as follows. In the case of an operation at a first frequency, a signal inputted to the first input terminal 701 is amplified by the first transistor 704 and is outputted to the first output terminal 707. In the case of an operation at a second frequency, a signal inputted to the second input terminal 708 is amplified by the second transistor 711 and is outputted to the second output terminal 714.

Moreover, for the signal inputs of the two kinds of frequencies, even when a signal with low output is obtained, the signal is passed through the first transistor 704 or the second transistor 712 and an amplifying operation is performed.

However, in such a configuration, there is a problem that the power amplifier is completely independent at each of the frequencies, and the number of components (not shown) between the power amplifier and an antenna is required for two systems, resulting in a large radio.

Furthermore, there is another problem that in use for a multistage amplifier and so on, since a power amplifier is generally adjusted so as to have the highest efficiency at the maximum output, even when output is reduced and a signal of low power is necessary, the power amplifier is operated. Thus, efficiency is degraded overall.

DISCLOSURE OF THE INVENTION

The present invention solves the above problems and has as its object the provision of a power amplifier having one system of an input and an output and operates at a plurality of different frequencies. The power amplifier switches signal paths according to output power and achieves low power consumption even at low output.

To achieve the above object, a first aspect of the present invention is a power amplifier, comprising:

branch output means having an input terminal and a plurality of output terminals, a plurality of amplifying means which are connected to some of the output terminals of the branch output means and are operated at different signal frequencies from each other, bypass means connected to the other output terminals of the branch output means, a synthesis output unit which receives outputs of the plurality of amplifying means and an output from the bypass means as inputs and has an output terminal connected to an outside, switch means of switching presence and absence of conduction of the bypass means, and control means of controlling conduction of the branch output means, conduction and an amplifying operation of the plurality of amplifying means, and conduction of the switch means, wherein according to the signal frequency and necessary output power, the control means performs control so that an input to the branch output means is amplified and outputted to the synthesis output unit via any one of the plurality of amplifying means or the input is outputted to the synthesis output unit via the bypass means without amplification.

A second aspect of the present invention is a power amplifier, comprising:

branch output means having an input terminal and a plurality of output terminals, a plurality of amplifying means which are connected to some of the outputs of the branch output means and are operated at different signal frequencies from each other, a transmission line group which is connected to the other output terminals of the branch output means and has a plurality of bypass transmission lines connected in series with each other, a synthesis output unit connected to each output of the plurality of amplifying means and an output from the transmission line group, first grounding means which is provided on a first node of the transmission line group and the branch output means and permits control of conduction, a plurality of second grounding means which are provided on second nodes between the bypass transmission lines of the transmission line group and permit control of conduction, and control means of controlling conduction of the branch output means, conduction and an amplifying operation of the plurality of amplifying means, conduction of the first grounding means, and conduction of the second grounding means, wherein taken from the synthesis output unit, a partial length from the transmission line group to each of the second nodes and an overall length of the transmission line group correspond to each of the signal frequencies of the plurality of amplifying means, the partial lengths starting with the shortest one sequentially correspond to the signal frequencies of the plurality of amplifying means, starting from the highest frequency to the lowest frequency, the overall length corresponds to the lowest signal frequency of the plurality of amplifying means, and according to the signal frequency and necessary output power, the control means performs control so that an input to the branch output means is amplified and outputted to the synthesis output unit via any one of the plurality of amplifying means or the input is outputted to the synthesis output unit via the transmission line group without amplification.

A third aspect of the present invention is a power amplifier, comprising:

branch output means having an input terminal and a plurality of output terminals, a plurality of amplifying means which are connected to some of outputs of the branch output means and are operated at different signal frequencies from each other, a transmission line connected to the other outputs of the branch output means, a synthesis output unit connected to each output of the plurality of amplifying means and an output from the transmission line, grounding means which is provided on a side of the branch output means of the transmission line and permits control of conduction, and control means of controlling conduction of the branch output means, conduction and an amplifying operation of the plurality of amplifying means, and conduction of the grounding means, wherein the signal frequencies are different from one another by even number times, a line length of the transmission line is one fourth of a wavelength of a signal of which the signal frequency is the lowest, and according to the signal frequency and necessary output power, the control means performs control so that an input to the branch output means is amplified and outputted to the synthesis output unit via any one of the plurality of amplifying means or the input is outputted to the synthesis output unit via the transmission line without amplification.

A fourth aspect of the present invention is the power amplifier according to any one of the first to the third aspects of the present invention, wherein the amplifying means comprises:

a first matching circuit provided on a side of the branch input means, a second matching circuit provided on a side of the synthesis output unit, a transistor provided between the first matching circuit and the second matching circuit, and a DC bias supply circuit provided between the first matching circuit and the transistor and/or between the second matching circuit and the transistor;

and at least one of the first matching circuit and the second matching circuit has variable impedance.

A fifth aspect of the present invention is the power amplifier according to the fourth aspect of the present invention, wherein the control means changes impedance of one or both of the first matching circuit and the second matching circuit according to output of any one of the plurality of operated amplifying means, the matching circuits being held by the operated amplifying means.

A sixth aspect of the present invention is the power amplifier according to the fourth aspect of the present invention, wherein the first matching circuit and/or the second matching circuit comprises:

an input terminal connected to the branch input means or an output side of the transistor, an output terminal connected to an input side of the transistor or the synthesis output unit, at least one series matching circuit element connected between the input terminal and the output terminal, at least one switch which is connected between the input terminal and the series matching circuit element, between the two series matching circuit elements, or between the series matching circuit element and the output terminal, and is controlled to as to be turned on and off by the control means, and a parallel matching circuit element connected to the other end of the switch.

A seventh aspect of the present invention is the power amplifier according to any one of the first to the third aspects of the present invention, wherein the branch input means comprises:

an amplifying means input switch for conduction with each of the plurality of amplifying means, and a bypass input switch for conduction with one of the bypass means, the transmission line, and the transmission line group;

and the amplifying means input switch operates as a distortion pre-compensating circuit.

A ninth aspect of the present invention is the power amplifier according to the fourth aspect of the present invention, further comprising a DC bias supply circuit for multi frequencies connected to a node between the output synthesis unit and the output terminal, wherein the DC bias supply circuit for multi frequencies operates according to the signal frequency corresponding to the operating amplifying means of the plurality of amplifying means.

A tenth aspect of the present invention is the power amplifier according to the ninth aspect of the present invention, wherein the DC bias supply circuit for multi frequencies comprises:

a transmission line group having a plurality of bias transmission lines which correspond to signal frequencies corresponding to the plurality of amplifying means and are connected in series with each other, a first bypass capacitor which is connected to one end of a highest-frequency bias transmission line corresponding to the highest signal frequency, which is provided on one end of the transmission line group and has the other end connected to the node, a first sub switch which is connected in series with the first bypass capacitor and is controlled so as to be turned on and off by the control means, at least one second bypass capacitor connected between the plurality of bias transmission lines of the transmission line group, a second sub switch connected in series with the second bypass capacitor, and a bias terminal which is provided on the other end of the transmission line group, is connected to a side not being connected to the other bias transmission lines, and is fed with DC bias supplied from the control means;

and the other end of the highest-frequency bias transmission line is grounded via the first bypass capacitor and the first sub switch, grounding is made between the plurality of bias transmission lines of the transmission line group other than the other end of the highest-frequency bias transmission line via the second bypass capacitor and the second sub switch, the first bypass capacitor is short-circuited at the highest signal frequency of the signal frequencies, and the second bypass capacitor is short-circuited at the signal frequency associated with a sum of lengths of transmission lines from the connecting position to the node.

An eleventh aspect invention of the present invention is a power amplifier having a multistage constitution, wherein the power amplifier described in any one of the first to the tenth aspect of the present invention is combined and used as an amplifier of at least one stage or more.

A twelfth aspect of the present invention is a power amplifier, wherein all or some parts of the power amplifier described in any one of the first to the tenth aspects of the present invention are configured on the same semiconductor substrate.

A thirteenth aspect of the present invention is a power amplifier, wherein all or some parts of the power amplifier described in any one of the first to the tenth aspects of the present invention are configured on a plurality of different semiconductor substrates from each other.

A fourteenth aspect of the present invention is a communication apparatus, comprising:

a signal processing circuit, a transmitting circuit which transmits a signal from the signal processing circuit and has a power amplifier, an antenna which transmits an output of the transmitting circuit and receives a reception signal, and a receiving circuit of processing the reception signal, wherein the power amplifier is the power amplifier described in any one of the first to the thirteenth aspects of the present invention.

DESCRIPTION OF THE SYMBOLS

Figure 1:
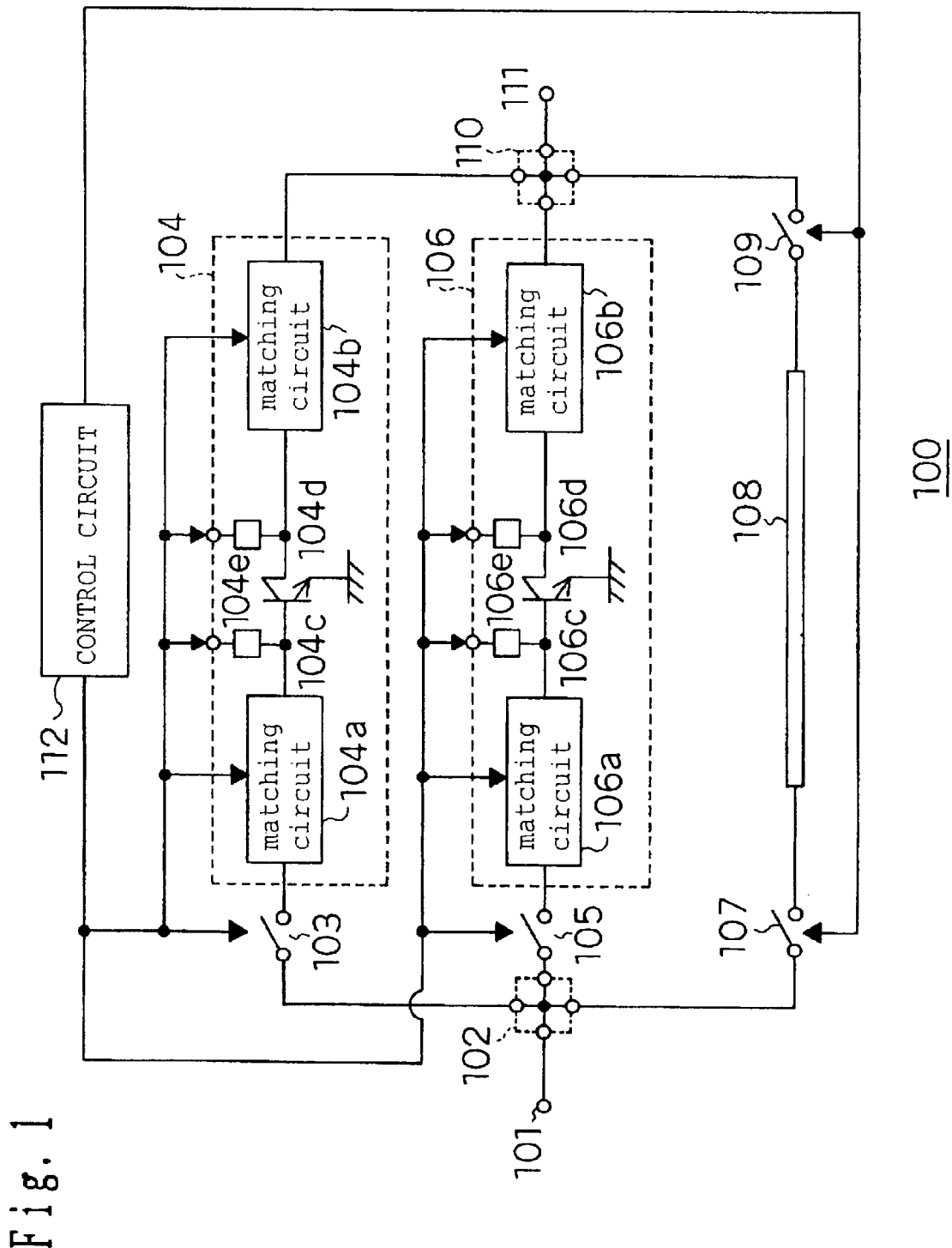
FIG. 1 is a block diagram showing the configuration according to Embodiment 1 of the present invention.

100, 200, 500, 603 power amplifier
101, 201, 301, 401, 501, 701, 708 input terminal
102, 202, 502 branch circuit
103, 105, 107, 109, 203, 205, 207, 209, 302, 305, 503, 505, 507, 509 switch
104, 106, 204, 206, 504, 506 amplifying means
104a, 104b, 106a, 106b, 204a, 204b, 206a, 206b, 300, 504a, 504b, 506a, 506b, 702, 706, 709, 713 matching circuit
104c, 104d, 106c, 106d, 204c, 204d, 206c, 206d, 504c, 506c, 703, 705, 710, 711 DC bias supply circuit
104c, 106c, 204c, 206c, 504d, 506d, 704, 712 transistor
108, 208, 508, 512a, 512d transmission line
110, 210, 510 synthesizing circuit
111, 211, 307, 404, 511, 707, 714 output terminal
112, 212, 513 control circuit
303, 306 parallel matching circuit element
304 series matching circuit element
402 DC AC separation circuit
402a AC signal path
402b DC signal path
403 diode
512c, 512f sub switch
512b, 512e bypass capacitor
512g DC bias supply terminal
514 node
600 portable radio
601 signal processing section
602 transmitting circuit
604 antenna
605 receiving circuit

BEST MODE FOR CARRYING OUT THE INVENTION

Referring to the accompanying drawings, the following describes operation of a power amplifier according to embodiments of the present invention.

(Embodiment 1)

Referring to FIG. 1, Embodiment 1 of the present invention will be discussed below. FIG. 1 is a block diagram showing a power amplifier 100 according to Embodiment 1 of the present invention. In FIG. 1, reference numeral 101 denotes an input terminal, reference numeral 102 denotes a branch circuit, reference numeral 103 denotes a first switch, reference numeral 104 denotes first amplifying means operating at a first frequency, reference numeral 104a denotes an input-side matching circuit, reference numeral 104b denotes an output-side matching circuit, reference numeral 104c denotes an input-side DC bias supply circuit, reference numeral 104d denotes an output-side DC bias supply circuit, reference numeral 104e denotes a transistor, reference numeral 105 denotes a second switch, reference numeral 106 denotes second amplifying means operating at a second frequency, reference numeral 106a denotes an input-side matching circuit, reference numeral 106b denotes an output-side matching circuit, reference numeral 106c denotes an input-side DC bias supply circuit, reference numeral 106d denotes an output-side DC bias supply circuit, reference numeral 106e denotes a transistor, reference numeral 107 denotes a third switch, reference numeral 108 denotes a transmission line, reference numeral 109 denotes a fourth switch, reference numeral 110 denotes a synthesizing circuit, reference numeral 111 denotes an output terminal, and reference numeral 112 denotes a control circuit.

The power amplifier 100 configured thus according to the present embodiment performs the operation described below.

The power amplifier 100 operates at the first frequency. In a first mode requiring an amplifying operation, the first switch 103 is turned on and the second to fourth switches 105, 107, and 109 are turned off by the control circuit 112. DC bias is supplied to the transistor 104e of the first amplifying means 104 via the DC bias supply circuits 104c and 104d so that a desired initial current is obtained. DC bias is supplied to the transistor 106e of the second amplifying means 106 via the DC bias supply circuits 106c and 106d so that an amplifying operation is not performed.

At this point, at the first frequency, the input-side and output-side matching circuits 106a and 106b of the second amplifying means 106 are changed by the control circuit 112 so that impedance to the second amplifying means 106 from an input connected to the second amplifying means 106 of the synthesizing circuit 110 is high impedance. However, only the output-side matching circuit 106b may be changed and the input-side matching circuit 106a does not always have to be changed.

Thus, a signal inputted from the input terminal 101 is amplified by the first amplifying means 104, and its output signal is outputted from the output terminal 111.

In a second mode operating at the first frequency and requiring no amplifying operation, the first and second switches 103 and 105 are turned off and the third and fourth switches 107 and 109 are turned on by the control circuit 112. DC bias is supplied to the transistors 104e and 106e of the first and second amplifying means 104 and 106 via the DC bias supply circuits 104c, 104d, 106c, and 106d so that an amplifying operation is not performed.

At this point, at the first frequency, the input-side and output-side matching circuits 104a and 104b of the first amplifying means 104 are changed by the control circuit 112 so that impedance to the first amplifying means 104 from an input connected to the first amplifying means 104 of the synthesizing circuit 110 is high impedance. The input-side and output-side matching circuits 106a and 106b of the second amplifying means 106 are changed by the control circuit 112 so that impedance to the second amplifying means 106 from the input connected to the second amplifying means 106 of the synthesizing circuit 110 is high impedance. However, only the output-side matching circuit 106b may be changed and the input-side matching circuit 106a does not always have to be changed.

Hence, a signal inputted from the input terminal 101 passes through the transmission line 108 and its output signal is outputted from the output terminal 111.

In a third mode operating at the second frequency and requiring an amplifying operation, the second switch 105 is turned on and the first, third and fourth switches 103, 107, and 109 are turned off by the control circuit 112. DC bias is supplied to the transistor 106e of the second amplifying means 106 via the DC bias supply circuits 106c and 106d so that a desired initial current is obtained. DC bias is supplied to the transistor 104e of the first amplifying means 104 via the DC bias supply circuits 104c and 104d so that an amplifying operation is not performed.

At this point, at the second frequency, the input-side and output-side matching circuits 104a and 104b of the first amplifying means 104 are changed by the control circuit 112 so that impedance to the first amplifying means 104 from the input connected to the first amplifying means 104 of the synthesizing circuit 110 is high impedance. However, only the output-side matching circuit 104b may be changed and the input-side matching circuit 104a does not always have to be changed.

Hence, a signal inputted from the input terminal 101 is amplified by the second amplifying means 106, and its output signal is outputted from the output terminal 111.

In a fourth mode operating at the second frequency and requiring no amplifying operation, the first and second switches 103 and 105 are turned off and the third and fourth switches 107 and 109 are turned on by the control circuit 112. DC bias is supplied to the transistors 104e and 106e of the first and second amplifying means 104 and 106 via the DC bias supply circuits 104c, 104d, 106c, and 106d so that an amplifying operation is not performed.

At this point, at the second frequency, the input-side and output-side matching circuits 104a and 104b of the first amplifying means 104 are changed by the control circuit 112 so that impedance to the first amplifying means 104 from the input connected to the first amplifying means 104 of the synthesizing circuit 110 is high impedance, and the input-side and output-side matching circuits 106a and 106b of the second amplifying means 106 are changed by the control circuit 112 so that impedance to the second amplifying means 106 from the input connected to the second amplifying means 106 of the synthesizing circuit 110 is high impedance. However, only the output-side matching circuits 104b and 106b may be changed and the input-side matching circuits 104a and 106a do not always have to be changed.

Hence, a signal inputted from the input terminal 101 passes through the transmission line 108 and its output signal is outputted from the output terminal 111.

The control circuit 112 performs control to switch the above four modes according to an operating frequency and output power.

As described above, according to the present embodiment, signal paths are switched according to an operating frequency and output power. Particularly in the second and fourth modes, an output signal is caused to bypass from the amplifying means and bias voltage not operating the amplifying means is supplied, so that consumed current of the amplifier for lower output power is reduced, thereby improving efficiency in a wide output range. Further, a signal path not requiring an amplifying operation is shared at two frequencies, and the output of the amplifier is provided as a single system, thereby reducing the size of the circuit.

The above explanation describes that the power amplifier 100 comprises the two amplifying means of the first amplifying means 104 which amplifies a signal of the first frequency and the second amplifying means 106 which amplifies a signal of the second frequency. The power amplifier of the present invention is not limited to the above. Three or more amplifying means may be provided for amplifying signals of different frequencies. In this case, a signal path not requiring amplifying operation can be shared at three frequencies or more.

(Embodiment 2)

Figure 2:
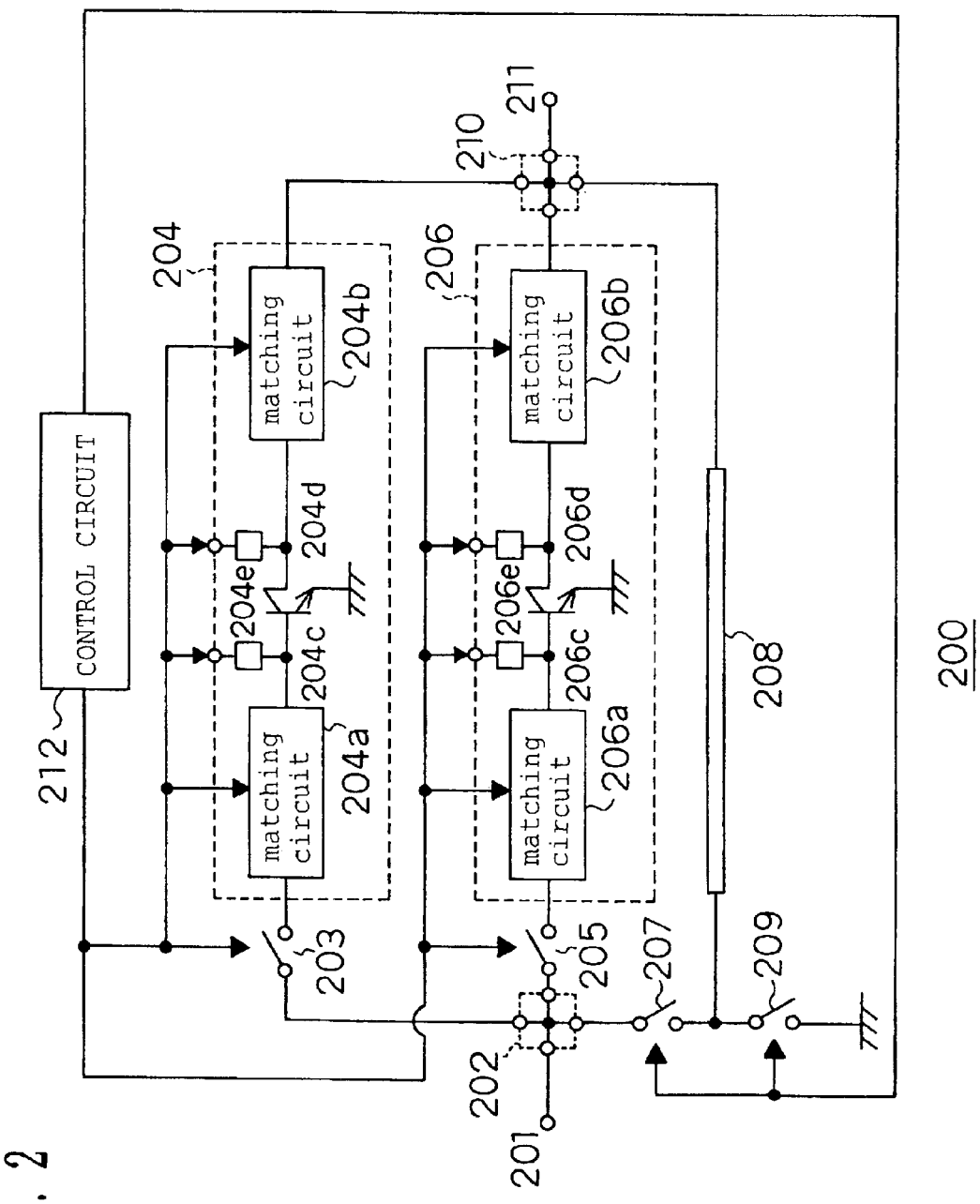
FIG. 2 is a block diagram showing the configuration according to Embodiment 2 of the present invention.

Referring to FIG. 2, Embodiment 2 of the present invention will be discussed below. FIG. 2 is a block diagram showing a power amplifier 200 according to Embodiment 2 of the present invention. In FIG. 2, reference numeral 201 denotes an input terminal, reference numeral 202 denotes a branch circuit, reference numeral 203 denotes a first switch, reference numeral 204 denotes first amplifying means operating at a first frequency, reference numeral 204a denotes an input-side matching circuit, reference numeral 204b denotes an output-side matching circuit, reference numeral 204c denotes an input-side DC bias supply circuit, reference numeral 204d denotes an output-side DC bias supply circuit, reference numeral 204e denotes a transistor, reference numeral 205 denotes a second switch, reference numeral 206 denotes second amplifying means operating at a second frequency which is even number times larger than the first frequency, reference numeral 206a denotes an input-side matching circuit, reference numeral 206b denotes an output-side matching circuit, reference numeral 206c denotes an input-side DC bias supply circuit, reference numeral 206d denotes an output-side DC bias supply circuit, reference numeral 206e denotes a transistor, reference numeral 207 denotes a third switch, reference numeral 208 denotes a transmission line, reference numeral 209 denotes a fourth switch, reference numeral 210 denotes a synthesizing circuit, reference numeral 211 denotes an output terminal, and reference numeral 212 denotes a control circuit.

Here, it is desirable that a line length of the transmission line 208 be one fourth of a wavelength of a first-frequency signal.

The power amplifier 200 configured thus according to the present embodiment performs the operation described below.

The power amplifier 200 operates at the first frequency. In a first mode requiring an amplifying operation, the first and fourth switches 203 and 209 are turned on and the second and third switches 205 and 207 are turned off by the control circuit 212. DC bias is supplied to the transistor 204e of the first amplifying means 204 via the DC bias supply circuits 204c and 204d so that a desired initial current is obtained. DC bias is supplied to the transistor 206e of the second amplifying means 206 via the DC bias supply circuits 206c and 206d so that an amplifying operation is not performed.

At this point, at the first frequency, the input-side and output-side matching circuits 206a and 206b of the second amplifying means 206 are changed by the control circuit 212 so that impedance to the second amplifying means 206 from an input connected to the second amplifying means 206 of the synthesizing circuit 210 is high impedance. However, only the output-side matching circuit 206b may be changed and the input-side matching circuit 206a does not always have to be changed.

Further, since the fourth switch 209 is turned on, impedance to the transmission line 208 from an input connected to the transmission line 208 of the synthesizing circuit 210 is high impedance at the first frequency and low impedance at the second frequency.

Hence, a signal inputted from the input terminal 201 is amplified by the first amplifying means 204, and its output signal is outputted from the output terminal 211.

In a second mode operating at the first frequency and requiring no amplifying operation, the first, second, and fourth switches 203, 205, and 209 are turned off and the third switch 207 is turned on by the control circuit 212. DC bias is supplied to the transistors 204e and 206e of the first and second amplifying means 204 and 206 via the DC bias supply circuits 204c, 204d, 206c, and 206d so that an amplifying operation is not performed.

At this point, at the first frequency, the input-side and output-side matching circuits 204a and 204b of the first amplifying means 204 are changed by the control circuit 212 so that impedance to the first amplifying means 204 from an input connected to the first amplifying means 204 of the synthesizing circuit 210 is high impedance. The input-side and output-side matching circuits 206a and 206b of the second amplifying means 206 are changed by the control circuit 212 so that impedance to the second amplifying means 206 from the input connected to the second amplifying means 206 of the synthesizing circuit 210 is high impedance. However, only the output-side matching circuits 204b and 206b may be changed and the input-side matching circuits 204a and 206a do not always have to be changed.

Hence, a signal inputted from the input terminal 201 passes through the transmission line 208, and its output signal is outputted from the output terminal 211.

In a third mode operating at the second frequency and requiring an amplifying operation, the second switch 205 is turned on and the first, third and fourth switches 203, 207, and 209 are turned off by the control circuit 212. DC bias is supplied to the transistor 206e of the second amplifying means 206 via the DC bias supply circuits 206c and 206d so that a desired initial current is obtained. DC bias is supplied to the transistor 204e of the first amplifying means 204 via the DC bias supply circuits 204c and 204d so that an amplifying operation is not performed.

At this point, at the second frequency, the input-side and output-side matching circuits 204a and 204b of the first amplifying means 204 are changed by the control circuit 212 so that impedance to the first amplifying means 204 from the input connected to the first amplifying means 204 of the synthesizing circuit 210 is high impedance. However, only the output-side matching circuit 204b may be changed and the input-side matching circuit 204a does not always have to be changed.

Further, since the third and fourth switches 207 and 209 are turned off, impedance to the transmission line 208 from the input connected to the transmission line 208 of the synthesizing circuit 210 is high impedance at the second frequency.

Hence, a signal inputted from the input terminal 201 is amplified by the second amplifying means 206, and its output signal is outputted from the output terminal 211.

In a fourth mode operating at the second frequency and requiring no amplifying operation, the first, second, and fourth switches 203, 205, and 209 are turned off and the third switch 207 is turned on by the control circuit 212. DC bias is supplied to the transistors 204e and 206e of the first and second amplifying means 204 and 206 via the DC bias supply circuits 204c, 204d, 206c, and 206d so that an amplifying operation is not performed.

At this point, at the second frequency, the input-side and output-side matching circuits 204a and 204b of the first amplifying means 204 are changed by the control circuit 212 so that impedance to the first amplifying means 204 from the input connected to the first amplifying means 204 of the synthesizing circuit 210 is high impedance, and the input-side and output-side matching circuits 206a and 206b of the second amplifying means 206 are changed by the control circuit 212 so that impedance to the second amplifying means 206 from the input connected to the second amplifying means 206 of the synthesizing circuit 210 is high impedance. However, only the output-side matching circuits 204b and 206b may be changed and the input-side matching circuits 204a and 206a do not always have to be changed.

Hence, a signal inputted from the input terminal 201 passes through the transmission line 208 and its output signal is outputted from the output terminal 211.

The control circuit 212 performs control to switch the above four modes, first to fourth modes according to an operating frequency and output power.

As described above, according to the present embodiment, in the case where one operating frequency is even number times larger than the other operating frequency, even when the circuit configuration is changed, it is possible to perform the same operation as Embodiment 1. Moreover, when the amplifying means is operated at a low frequency, the transmission line 208 has low impedance at a high frequency which is a harmonic of an output signal of a low frequency and suppresses a harmonic content. Thus, it is possible to realize a higher harmonic processing circuit without the necessity for providing another circuit for harmonic processing.

Further, as compared with Embodiment 1, since no switch is provided between the transmission line 208 and the synthesizing circuit 210, it is possible to reduce internal loss and efficiently transmit signals.

Besides, the above explanation has described that the power amplifier 200 comprises the two amplifying means of the first amplifying means 204 which amplifies a signal of the first frequency and the second amplifying means 206 which amplifies a signal of the second frequency which is even number times larger than the first frequency. The power amplifier of the present invention is not limited to the above. Three or more amplifying means may be provided for amplifying signals whose frequencies are different from one another by even number times.

(Embodiment 3)

Figure 9:
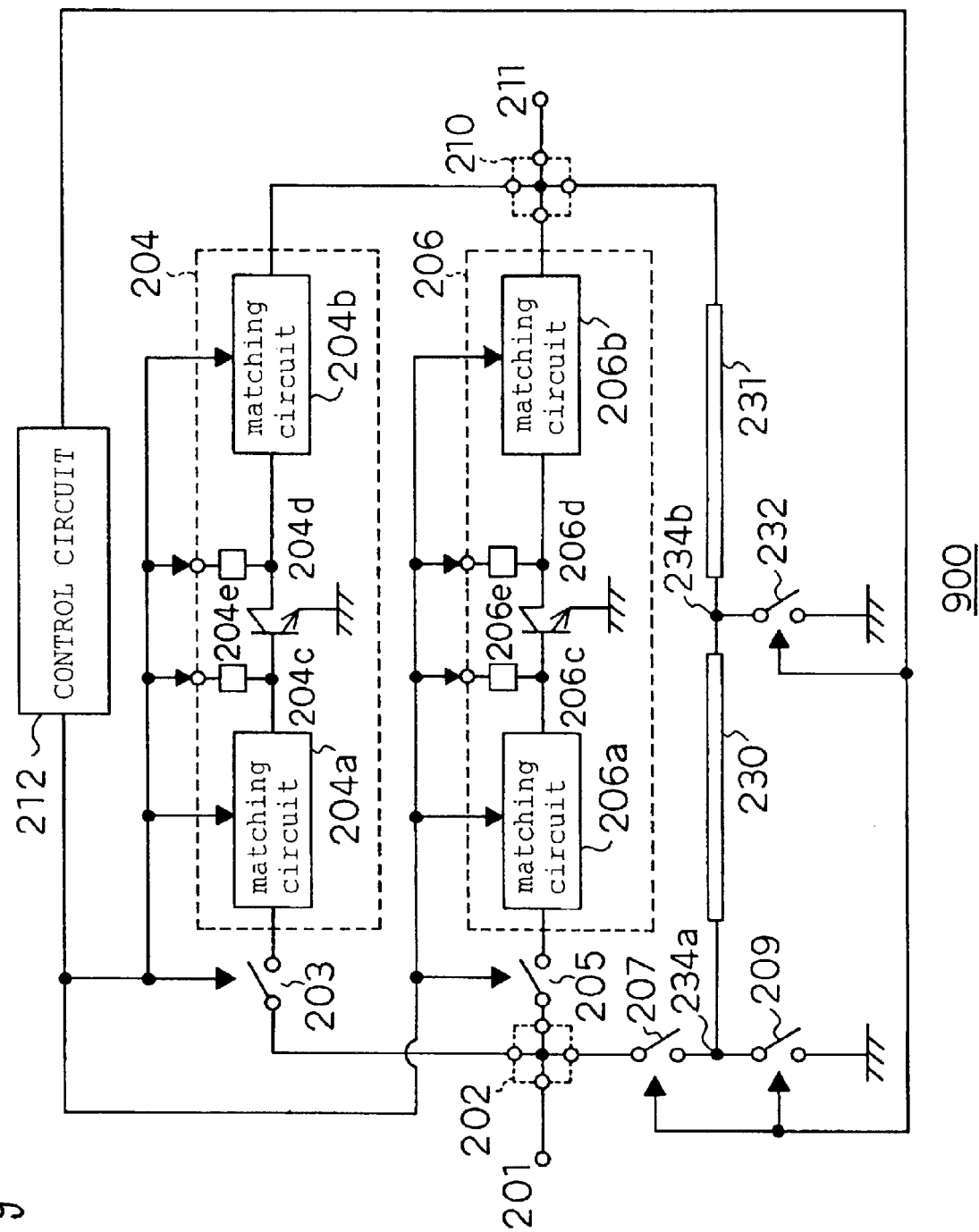
FIG. 9 is a block diagram showing the configuration according to Embodiment 3 of the present invention.

Referring to FIG. 9, Embodiment 3 of the present invention will be discussed below. FIG. 9 is a block diagram showing a power amplifier 900 according to Embodiment 3 of the present invention. In FIG. 9, the same parts or the corresponding parts of FIG. 2 are indicated by the same reference numerals and the detailed description thereof will be omitted. However, as to the relationship between a first frequency where first amplifying means 204 operates and a second frequency where second amplifying means 206 operates, the second frequency is simply set higher than the first frequency and does not have to be higher than the first frequency by even number times.

Further, reference numeral 230 denotes a first transmission line and reference numeral 231 denotes a second transmission line. The first transmission line 230 and the second transmission line 231 have each one end connected in series with each other via the second node 234b. The other end of the first transmission line 230 is connected to a first node 234a between a third switch 207 and a fourth switch 209 and the other end of the second transmission line 231 is connected to a synthesizing circuit 210, so that a bypass transmission line group of the present invention is formed. Moreover, a fifth switch 232 where conduction is controlled by control means 212 is provided on the second node 234b, and the second node 234b is grounded via the fifth switch 232.

Here, the second transmission line 231 has a line length which is one fourth of a wavelength of a second frequency signal on the side of the second amplifying means 206, and the sum of the line length of the first transmission line 230 and the line length of the second transmission line 231 is one fourth of a wavelength of a first frequency signal on the side of the first amplifying means 204.

The power amplifier 900 configured thus according to the present embodiment performs the operation described below.

The power amplifier 900 operates at the first frequency. In a first mode requiring an amplifying operation, first and fourth switches 203 and 209 are turned on and the second, third, and fifth switches 205, 207, and 232 are turned off by the control circuit 212. DC bias is supplied to a transistor 204e of the first amplifying means 204 via DC bias supply circuits 204c and 204d so that a desired initial current is obtained. DC bias is supplied to a transistor 206e of the second amplifying means 206 via DC bias supply circuits 206c and 206d so that an amplifying operation is not performed.

At this point, at the first frequency, input-side and output-side matching circuits 206a and 206b of the second amplifying means 206 are changed by the control circuit 212 so that impedance to the second amplifying means 206 from an input connected to the second amplifying means 206 of the synthesizing circuit 210 is high impedance. However, only the output-side matching circuit 206b may be changed and the input-side matching circuit 206a does not always have to be changed.

Further, since the fourth switch 209 is turned on and the fifth switch 232 is turned off, impedance to the first transmission line 230 and the second transmission line 231 from an input connected to the first transmission line 230 and the second transmission line 231 of the synthesizing circuit 210 is high impedance at the first frequency.

Hence, a signal inputted from the input terminal 201 is amplified in the first amplifying means 204 and its output signal is outputted from the output terminal 211.

In a second mode operating at the first frequency and requiring no amplifying operation, the first, second, fourth, and fifth switches 203, 205, 209, and 232 are turned off and the third switch 207 is turned on by the control circuit 212. DC bias is supplied to the transistors 204e and 206e of the first and second amplifying means 204 and 206 via the DC bias supply circuits 204c, 204d, 206c, and 206d so that an amplifying operation is not performed.

At this point, at the first frequency, the input-side and output-side matching circuits 204a and 204b of the first amplifying means 204 are changed by the control circuit 212 so that impedance to the first amplifying means 204 from an input connected to the first amplifying means 204 of the synthesizing circuit 210 is high impedance, and the input-side and output-side matching circuits 206a and 206b of the second amplifying means 206 are changed by the control circuit 212 so that impedance to the second amplifying means 206 from the input connected to the second amplifying means 206 of the synthesizing circuit 210 is high impedance. However, only the output-side matching circuits 204b and 206b may be changed and the input-side matching circuits 204b and 206a do not always have to be changed.

Hence, a signal inputted from the input terminal 201 passes through the first transmission line 230 and the second transmission line 231 and its output signal is outputted from an output terminal 211.

In a third mode operating at a second frequency and requiring an amplifying operation, the second switch 205 and the fifth switch 232 are turned on and the first, third and fourth switches 203, 207, and 209 are turned off by the control circuit 212. DC bias is supplied to the transistor 206e of the second amplifying means 206 via the DC bias supply circuits 206c and 206d so that a desired initial current is obtained. DC bias is supplied to the transistor 204e of the first amplifying means 204 via the DC bias supply circuits 204c and 204d so that an amplifying operation is not performed.

At this point, at the second frequency, the input-side and output-side matching circuits 204a and 204b of the first amplifying means 204 are changed by the control circuit 212 so that impedance to the first amplifying means. 204 from the input connected to the first amplifying means 204 of the synthesizing circuit 210 is high impedance. However, only the output-side matching circuit 204b may be changed and the input-side matching circuit 204a does not always have to be changed.

Further, since the third and fourth switches 207 and 209 are turned off and the fifth switch 232 is turned on, impedance to the second transmission line 231 from an input connected to the second transmission line 231 of the synthesizing circuit 210 is high impedance at the second frequency.

Hence, a signal inputted from the input terminal 201 is amplified in the second amplifying means 206 and its output signal is outputted from the output terminal 211.

In a fourth mode operating at the second frequency and requiring no amplifying operation, the first, second, fourth, and fifth switches 203, 205, 209, and 232 are turned off and the third switch 207 is turned on by the control circuit 212. DC bias is supplied to the transistors 204e and 206e of the first and second amplifying means 204 and 206 via the DC bias supply circuits 204c, 204d, 206c, and 206d so that an amplifying operation is not performed.

At this point, at the second frequency, the input-side and output-side matching circuits 204a and 204b of the first amplifying means 204 are changed by the control circuit 212 so that impedance to the first amplifying means 204 from the input connected to the first amplifying means 204 of the synthesizing circuit 210 is high impedance, and the input-side and output-side matching circuits 206a and 206b of the second amplifying means 206 are changed by the control circuit 212 so that impedance to the second amplifying means 206 from the input connected to the second amplifying means 206 of the synthesizing circuit 210 is high impedance. However, only the output-side matching circuits 204b and 206b may be changed and the input-side matching circuits 204a and 206a do not always have to be changed.

Hence, a signal inputted from the input terminal 201 passes through the first transmission line 230 and the second transmission line 231 and its output signal is outputted from the output terminal 211.

The control circuit 212 performs control to switch the above four modes, the first to fourth modes according to an operating frequency and output power.

As described above, according to the present embodiment, like Embodiment 1, an output signal is caused to bypass from the amplifying means and bias voltage not operating the amplifying means is supplied, so that efficiency can be improved over a wide output range by reducing consumed current of the amplifiers when output power is reduced. Further, when an amplifying operation is not necessary, the signal path is shared at two frequencies and an output of the amplifier is provided as a single system, thereby achieving a smaller circuit. Since there is no switch between the first transmission line 230 and the second transmission line 231 and the synchronizing circuit 210, internal loss can be reduced accordingly and thus signals can be efficiently transmitted.

Additionally, the above explanation has described that the power amplifier 900 comprises the two amplifying means of the first amplifying means 204 which amplifies a signal of the first frequency and the second amplifying means 206 which amplifies a signal of the second frequency higher than the first frequency. The power amplifier of the present invention is not limited to the above. Three or more amplifying means may be provided for amplifying signals of different frequencies. At this point, the number of transmission lines connected in series is prepared according to the number of the amplifying means, and grounding is made between the transmission lines via a switch where conduction can be controlled by control means, just like the fifth switch 232.

Taken from the synchronizing circuit 210, partial lengths of the plurality of transmission lines to the nodes and overall lengths of the transmission lines connected in series are caused to correspond to the signal frequencies of the plurality of amplifying means, respectively. It is preferable that the partial lengths starting with the shortest one sequentially correspond to signal frequencies of the plurality of amplifying means, starting from the highest frequency to the lowest frequency, and an overall length corresponding to the lowest signal frequency of the plurality of amplifying means is used. The control means controls conduction of the switches between the transmission lines according to frequencies of the operating amplifying means, so that the same operation as that of the above embodiment can be performed even when three or more amplifying means are provided. In this case as well, it is desirable that a length corresponding to a partial length and an overall length be equivalent to one fourth of a wavelength corresponding to each of the signal frequencies.

Besides, in Embodiments 1 to 3, the first and second switches are operated as distortion pre-compensating circuits, so that efficiency can be improved particularly for a system demanding linearity.

Further, DC bias of the operating amplifying means can be changed according to output power to reduce consumed current is reduced while satisfying a desired characteristic, so that efficiency can be improved.

Furthermore, efficiency can be also improved by the following operation: one or both of the input-side and the output-side matching circuits of the operating amplifying means are changed according to output power and are used under an optimum load of the output power.

Figure 3:
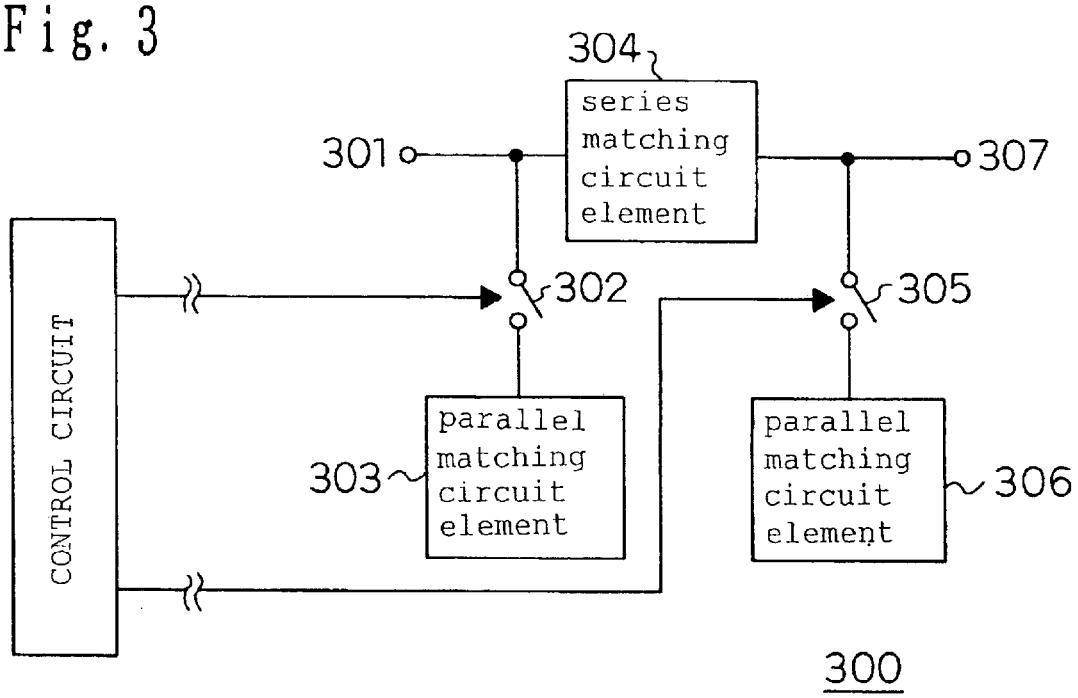
FIG. 3 is a block diagram showing the configuration of a matching circuit according to Embodiments 1 to 3 of the present invention.

FIG. 3 is a block diagram showing one example of the configuration of the matching circuit in the amplifying means according to Embodiments 1 to 3. In a matching circuit 300, reference-numeral 301 denotes an input terminal, reference numeral 302 denotes a first switch, reference numeral 303 denotes a first parallel matching circuit element, reference numeral 304 denotes a series matching circuit element, reference numeral 305 denotes a second switch, reference numeral 306 denotes a second parallel matching circuit element, and reference numeral 307 denotes an output terminal. For example, the series matching circuit element is realized by a coil, a capacitor, and a transmission line. For example, the element is realized as a coil having both ends respectively connected to the input terminal 301 and the output terminal 307. The first parallel matching circuit element 303 and the second parallel matching circuit element 306 are realized as, for example, capacitors having one end being grounded.

The turning on and off of the first and second switches 302 and 305 are switched in response to a control signal from the control circuits 112 and 212, so that the matching circuit 300 is changed in impedance. The number of circuits composed of the first and second switches 302 and 305 and the first and second parallel matching circuit elements 303 and 306 is increased, so that the matching circuit can be adjusted in a more elaborate manner. When it is not necessary to switch the matching circuits, a matching circuit with constant impedance can be realized by eliminating the circuit composed of the first and second switches 302 and 305 and the first and second parallel matching circuit elements 303 and 306. With the above arrangement, the operations of Embodiments 1 to 3 can be realized.

(Embodiment 4)

Figure 4:
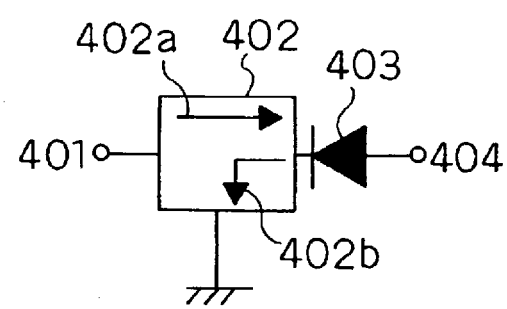
FIG. 4 is a block diagram showing an input changeover switch according to Embodiment 4 of the present invention.
Figure 8:
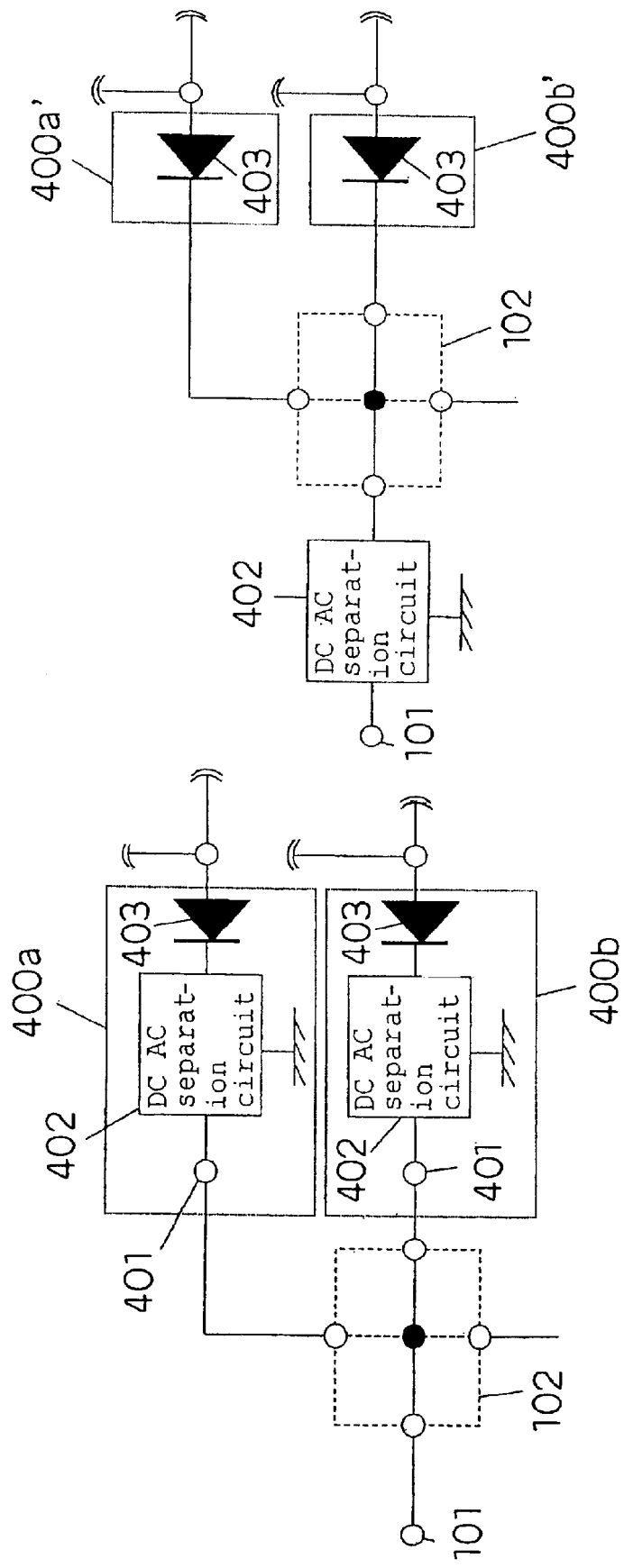
FIG. 8 is a partial structural diagram for explaining the case where the input changeover switch of Embodiment 4 is used for Embodiment 1 according to the present invention.

FIG. 4 is a block diagram showing an example in which the input-side switches of amplifying means 104 and 106 (204 and 206) are each constituted by a diode turned on and off by input-side DC bias of a transistor. FIG. 4 shows a circuit that is used when the input-side DC bias that the transistors of the amplifying means 104 and 106 require to perform amplifying, needs positive voltage. A switch 400 is a switch used as the first switch 103 and the second switch 105 shown in FIG. 1. In the switch 400, reference numeral 401 denotes an input terminal, reference numeral 402 denotes a DC AC separation circuit, reference numeral 402a denotes an AC signal path, reference numeral 402b denotes a DC signal path, reference numeral 403 denotes a diode, and reference numeral 404 denotes an output terminal. Further, FIG. 8a shows a partial diagram of a power amplifier when the switch 400 is used for the first switch 103 of Embodiment 1 (400a in FIG. 8(a)) and when the switch 400 is used for the second switch 105 of Embodiment 1 (400b in FIG. 8(a)). Additionally, since the operations of the whole circuit are the same as those of Embodiments 1 and 2, only the operations of the input-side switches of the first amplifying means 104 and the second amplifying means 106 will be described later.

When the amplifying means 104 or 106 is operated, DC bias supplied to the input side of the transistor 104e or 106e is also applied to the anode of the diode 403, and the cathode of the diode 403 is grounded in DC manner by the DC AC separation circuit 402. Thus, current is applied to the diode 403 and the switch 400 is turned on. When the first amplifying means 104 or the second amplifying means 106 is not operated, DC bias is supplied so that the transistor 104e or 106e and the diode 403 are both turned off.

With this arrangement, the control terminals of the amplifying means 104 and 106 and the input-side switches 103 and 105 can be shared while realizing the operations of Embodiments 1 and 2, and control lines from the control circuit can be reduced.

Further, as shown in FIG. 8(b), the DC AC separation circuits 402 respectively held by the switch 400a serving as the first switch 103 and the switch 400b serving as the second switch 105 are shared. And the DC AC separation circuit 402 is arranged between the input terminal 101 and a branch circuit 102, and the first and second switches are realized respectively as 400a' and 400b', each being only composed of the diode 403. Thus, the circuit can be further reduced in size.

Moreover, it is apparent that improved efficiency of Embodiment 2 can be achieved by operating the switch composed of the diode 403 as a distortion pre-compensating circuit.

(Embodiment 5)

Figure 5:
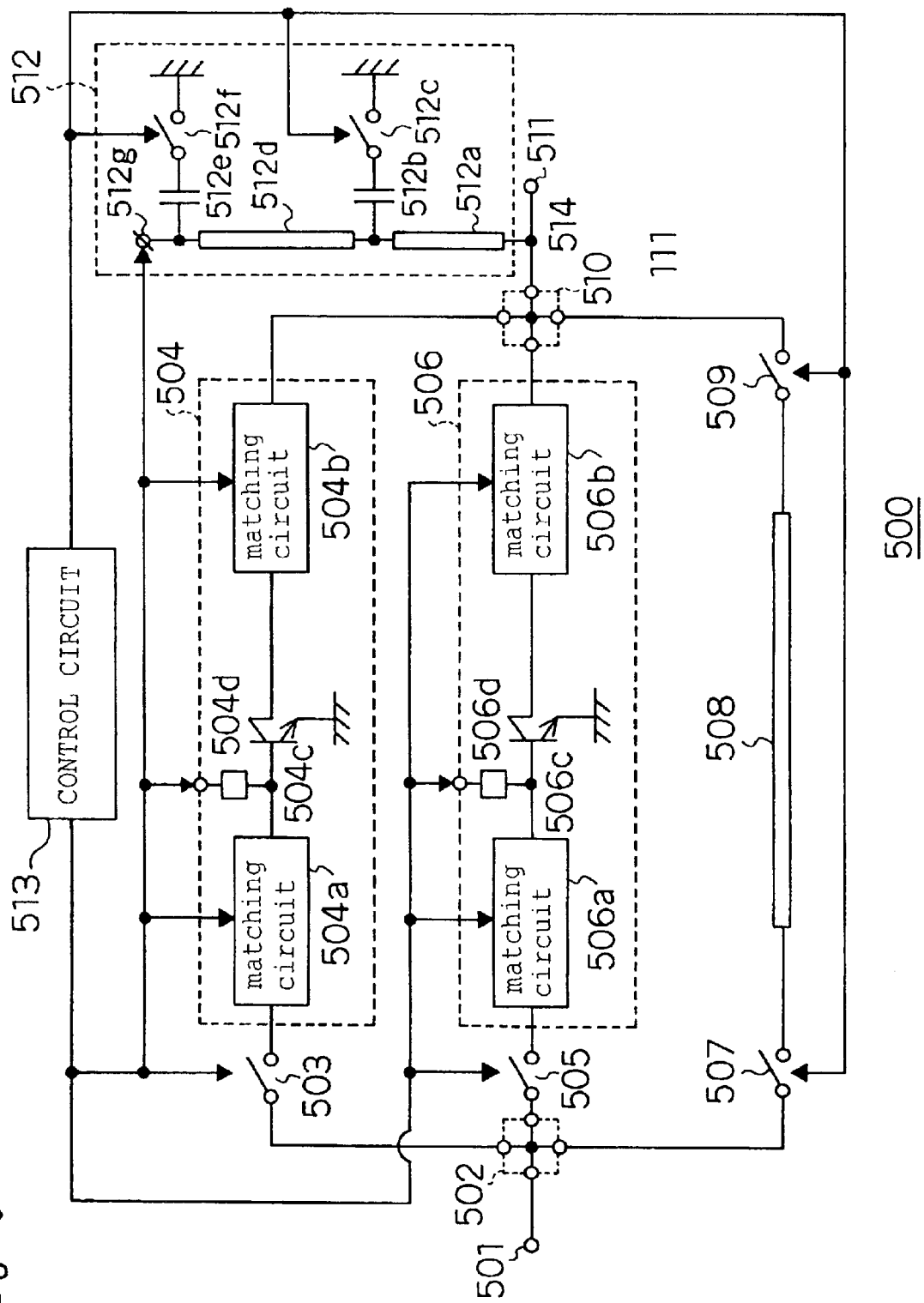
FIG. 5 is a block diagram showing the configuration according to Embodiment 5 of the present invention.

Referring to FIG. 5, Embodiment 5 of the present invention will be discussed below. FIG. 5 is a block diagram showing a power amplifier 500 according to Embodiment 5 of the present invention. In FIG. 5, since the circuit configuration is almost the same as that of Embodiment 1, only different points will be described. First and second amplifying means 504 and 506 are respectively composed of input-side matching circuits 504a and 506a, output-side matching circuits 504b and 506b, and transistors 504d and 506d having DC bias supply circuits 504c and 506c only on the input side. Output-side DC bias of the transistors 504d and 506d in the amplifying means 504 and 506 is supplied by a DC bias supply circuit for two frequencies 512. The DC bias supply circuit for two frequencies 512 is connected to a node 514 provided between a synthesizing circuit 510 and an output terminal 511. At this point, the output-side matching circuits 504b and 506b of the first and second amplifying means both have to be configured so as to apply DC bias to the transistors 504d and 506d. Besides, when necessary, a DC cutoff circuit may be provided between the node 514 and the output terminal 511.

In the DC bias supply circuit for two frequencies 512, a first bias transmission line 512a has one end directly connected between the synthesizing circuit 510 and the output terminal 511 via the node 514 and the other end connected to one end of a second bias transmission line 512d. The other end of the second bias transmission line 512d is connected to a DC bias supply terminal 512g and fed with DC bias from a control circuit 513. Further, grounding is made between the first bias transmission line 512a and the second bias transmission line 512d via a first bypass capacitor 512b and a first sub switch 512c, and grounding is made between the second bias transmission line 512d and the DC bias supply terminal 512g via a second bypass capacitor 512e and a second sub switch 512f. Further, the line length of the first bias transmission line 512a is one fourth of a wavelength of a high-frequency signal corresponding to the first amplifying means 504, and the sum of the line length of the first bias transmission line 512a and the line length of the second bias transmission line 512d is one fourth of a wavelength of a low frequency corresponding to the second amplifying means 506.

The present embodiment configured thus is operated in the following manner.

When an operation is performed at a high frequency of two frequencies, the control circuit 513 performs control to turn on the first sub switch 512c, and necessary DC bias is supplied to the DC bias supply terminal 512g.

Hence, since grounding is made on the first bypass capacitor 512b connected to the first bias transmission line 512a having a length of one fourth of a wavelength at a high frequency, impedance to the DC bias supply circuit for two frequencies 512 from the node 514 at a high frequency is high impedance.

When an operation is performed at a low frequency of two frequencies, the control circuit 513 performs control to turn off the first sub switch 512c and turn on the second sub switch 512f, and necessary DC bias is supplied to the DC bias supply terminal 512g.

Hence, the sum of the lengths of the first and second bias transmission lines 512a and 512d is a length of one fourth of a wavelength at a low frequency, and the second bypass capacitor 512e connected to the second bias transmission line 512d is grounded by turning on the second sub switch 512f by the control circuit 513. Thus, impedance to the DC bias supply circuit for two frequencies 512 from the node 514 at a low frequency is high impedance.

Hence, DC bias can be applied by the DC bias supply circuit shared by the two transistors without affecting a high-frequency signal. Additionally, even when the second sub switch 512f (or a sub switch closest to the DC bias supply terminal 152g) is not present, the same operation can be performed and the number of switches requiring control can be reduced.

Although the above explanation has described the case with the circuit configuration of Embodiment 1, the operation of Embodiment 2 can be performed when the DC bias supply circuit for two frequencies is used in the circuit configurations of Embodiments 2 and 3.

Although the above explanation has described that the first sub switch 512c and the first sub switch 512f are both provided between the bypass capacitor and a ground, the capacitor and switches only have to be connected in series and the bypass capacitor may be provided between the switches and the ground.

Besides, the above explanation has described that the power amplifier 500 comprises the two amplifying means of the first amplifying means 504 which amplifies a signal of a first frequency and the second amplifying means 506 which amplifies a signal of a second frequency. The power amplifier of the present invention is not limited to the above. Like Embodiment 1, three or more amplifying means may be provided for amplifying signals of different frequencies. At this point, the DC bias supply circuit for two frequencies 512 serves as a DC bias supply circuit for multi frequencies of dealing with signals as many as signals processed by the amplifying means. And it is desirable that in the DC bias supply circuit for multi frequencies, as a highest-frequency bias transmission line of the present invention, one end of the bias transmission line having a one-fourth wavelength at the highest frequency is connected to the node 514 and the number of bias transmission lines connected in series between the node 514 and the DC bias supply terminal 512g is increased. At this point, it is desirable that a length from the node 514 to the nodes of the increased bias transmission lines be set at one fourth of a wavelength of a corresponding signal of the amplifying means which corresponds to each of the increased bias transmission lines.

Further, in the case of the configuration according to Embodiment 2, three or more amplifying means may be provided for amplifying signals of frequencies different from one another by even number times. In this case as well, the DC bias supply circuit for two frequencies 512 serves as a DC bias supply circuit for multi frequencies of dealing with signals as many as signals processed by the amplifying means. And it is desirable that in this DC bias supply circuit for multi frequencies, as a highest-frequency bias transmission line of the present invention, one end of the bias transmission line having a one-fourth wavelength at the highest frequency is connected to the node 514 and the number of bias transmission lines connected in series between the node 514 and the DC bias supply terminal 512g is increased. At this point, it is desirable that a length from the node 514 to the nodes of the increased bias transmission lines be set at one fourth of a wavelength of a corresponding signal of the amplifying means which corresponds to each of the increased bias transmission lines.

Additionally, efficiency can be improved more elaborately in the step of output power by connecting the power amplifiers shown in Embodiments 1 to 5 in multiple stages.

Furthermore, the power amplifiers of Embodiments 1 to 5 or multistage power amplifiers using the above amplifiers are arranged on the same semiconductor substrate, so that the circuit can be reduced in size.

Moreover, some are arranged on the same semiconductor substrate and the other parts are arranged on a semiconductor substrate made of different materials in a different process, so that each excellent characteristic can be shared.

Figure 6:
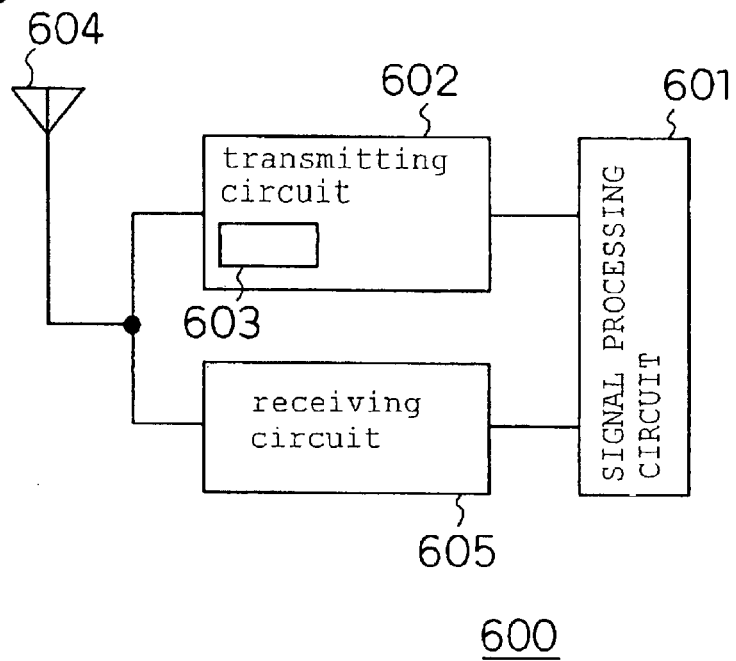
FIG. 6 is a block diagram showing one example of a mobile wireless unit according to the present invention.
Figure 7:
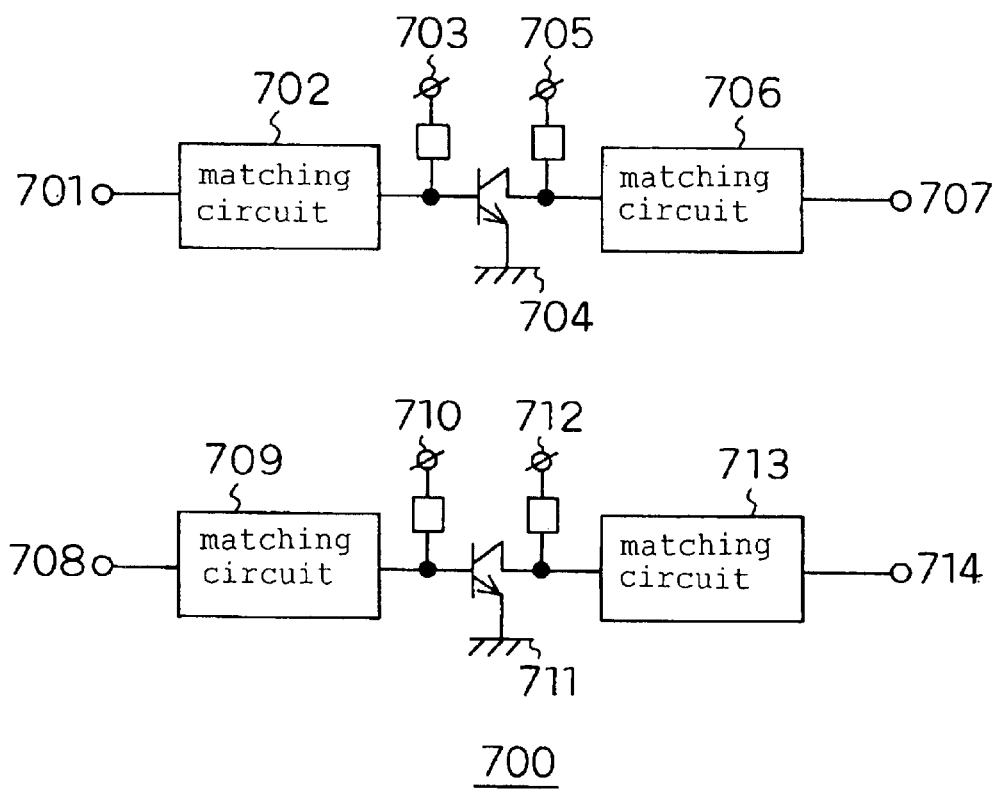
FIG. 7 is a block diagram showing the configuration of a conventional power amplifier.

A portable radio of FIG. 6 is configured using the power amplifiers of Embodiments 1 to 5, so that it is possible to achieve a communication apparatus such as a portable radio, which can be used at least at two frequencies with a small size and high efficiency.

Besides, in the above embodiments, the input terminals 101, 201, and 501, the first switches 103, 203, and 503, the second switches 105, 205, and 505, and the third switches 107, 207, and 507 correspond to branch output means of the present invention. Further, the first switches 103, 203, and 503 and the second switches 105, 205, and 505 correspond to an amplifying means input switch of the present invention, the third switches 107, 207, and 507 correspond to a bypass input switch of the present invention, and the transmission line 108 corresponds to bypass means of the present invention. Moreover, the input-side DC bias supply circuits 104c, 204c, 106c, 206c, and 504c and the output-side DC bias supply circuits 104d, 106d, 204d, and 206d correspond to a DC bias supply circuit of the present invention. Additionally, the synchronizing circuits 110, 210, and 510 correspond to a synthesis output unit of the present invention. Further, the fourth switches 109 and 509 correspond to a transmission line output switch of the present invention. Besides, the fourth switch 209 is included in grounding means of the present invention. Moreover, the input-side matching circuits 104a, 204a, 504a, 106a, 206a, and 506a correspond to a first matching circuit of the present invention, and the output-side matching circuits 104b, 204b, 504b, 106b, 206b, and 506b correspond to a second matching circuit of the present invention. Additionally, the control circuits 113, 213, and 513 correspond to control means of the present invention. Moreover, the first bias transmission line 512a corresponds to a highest-frequency bias transmission line of the present invention, and the first bias transmission line 512a and the second bias transmission line 512d correspond to a transmission line group of the present invention.

Further, in Embodiment 2, the first transmission line 230 and the second transmission line 231 correspond to a bypass transmission line of the second invention, the fourth switch 209 is included in first grounding means of the second invention, and the fifth switch 209 is included in second grounding means of the second invention.

As is evident from the above description, according to the present invention, it is possible to achieve miniaturization and higher efficiency at low output for a power amplifier comprising a plurality of amplifying means which amplify signals of different frequency bands.

What is claimed is:

1. A power amplifier, comprising:

branch output means having an input terminal and a plurality of output terminals, a plurality of amplifying means which are connected to some of the output terminals of the branch output means and are operated at different signal frequencies from each other, bypass means connected to the other output terminals of the branch output means, a synthesis output unit which receives outputs of the plurality of amplifying means and an output from the bypass means as inputs and has an output terminal connected to an outside, switch means of switching presence and absence of conduction of the bypass means, and control means of controlling conduction of the branch output means, conduction and an amplifying operation of the plurality of amplifying means, and conduction of the switch means, wherein each of said amplifying means includes:

a first matching circuit provided on a side of the branch input means, a second matching circuit provided on a side of the synthesis output unit, a transistor provided between the first matching circuit and the second matching circuit, and a DC bias supply circuit for an operation of the amplification of said transmitter, said second matching circuit of said amplifying means is configured so that impedance to the plurality of said amplifying means from said synthesis output unit is high impedance in all signal frequencies, in the case that said respective amplifying means connected to said second matching circuit does not perform amplification, and according to the signal frequency and necessary output power, the control means performs control so that an input to the branch output means is amplified and outputted to the synthesis output unit via any one of the plurality of amplifying means or the input is outputted to the synthesis output unit via the bypass means without amplification.

2. A power amplifier, comprising:

branch output means having an input terminal and a plurality of output terminals, a plurality of amplifying means which are connected to some of outputs of the branch output means and are operated at different signal frequencies from each other, a transmission line group which is connected to the other output terminals of the branch output means and has a plurality of bypass transmission lines connected in series with each other, a synthesis output unit connected to each output of the plurality of amplifying means and an output from the transmission line group, first grounding means which is provided on a first node of the transmission line group and the branch output means and permits control of conduction, a plurality of second grounding means which are provided on second nodes between the bypass transmission lines of the transmission line group and permit control of conduction, and control means of controlling conduction of the branch output means, conduction and an amplifying operation of the plurality of amplifying means, conduction of the first grounding means, and conduction of the second grounding means, wherein taken from the synthesis output unit, a partial length from the transmission line group to each of the second nodes and an overall length of the transmission line group correspond to each of the signal frequencies of the plurality of amplifying means, the partial lengths starting with the shortest one sequentially correspond to the signal frequencies of the plurality of amplifying means, starting from the highest frequency to the lowest frequency, the overall length corresponds to the lowest signal frequency of the plurality of amplifying means, and according to the signal frequency and necessary output power, the control means performs control so that an input to the branch output means is amplified and outputted to the synthesis output unit via any one of the plurality of amplifying means or the input is outputted to the synthesis output unit via the transmission line group without amplification.

3. A power amplifier, comprising:

branch output means having an input terminal and a plurality of output terminals, a plurality of amplifying means which are connected to some of outputs of the branch output means and are operated at different signal frequencies from each other, a transmission line connected to the other outputs of the branch output means, a synthesis output unit connected to each output of the plurality of amplifying means and an output from the transmission line, grounding means which is provided on a side of the branch output means of the transmission line and permits control of conduction, and control means of controlling conduction of the branch output means, conduction and an amplifying operation of the plurality of amplifying means, and conduction of the grounding means, wherein the signal frequencies are different from one another by even number times, a line length of the transmission line is one fourth of a wavelength of a signal of which the signal frequency is the lowest, and according to the signal frequency and necessary output power, the control means performs control so that an input to the branch output means is amplified and outputted to the synthesis output unit via any one of the plurality of amplifying means or the input is outputted to the synthesis output unit via the transmission line without amplification.

4. The power amplifier according to claim 2 or 3, wherein the amplifying means comprises:

a first matching circuit provided on a side of the branch input means, a second matching circuit provided on a side of the synthesis output unit, a transistor provided between the first matching circuit and the second matching circuit, and a DC bias supply circuit provided between the first matching circuit and the transistor and/or between the second matching circuit and the transistor;

and at least one of the first matching circuit and the second matching circuit has variable impedance.

5. The power amplifier according to claim 4, wherein the control means changes impedance of one or both of the first matching circuit and the second matching circuit according to output of any one of the plurality of operated amplifying means, the matching circuits being held by the operated amplifying means.

6. The power amplifier according to claim 4, wherein the first matching circuit and/or the second matching circuit comprises:

an input terminal connected to the branch input means or an output side of the transistor, an output terminal connected to an input side of the transistor or the synthesis output unit, at least one series matching circuit element connected between the input terminal and the output terminal, at least one switch which is connected between the input terminal and the series matching circuit element, between the two series matching circuit elements, or between the series matching circuit element and the output terminal, and is controlled to as to be turned on and off by the control means, and a parallel matching circuit element connected to the other end of the switch.

7. The power amplifier according to any one of claims 1 to 3, wherein the branch input means comprises:

an amplifying means input switch for conduction with each of the plurality of amplifying means, and a bypass input switch for conduction with one of the bypass means, the transmission line, and the transmission line group;

and the amplifying means input switch operates as a distortion pre-compensating circuit.

8. The power amplifier according to claim 4, further comprising a DC bias supply circuit for multi frequencies connected to a node between the output synthesis unit and the output terminal, wherein the DC bias supply circuit for multi frequencies operates according to the signal frequency corresponding to the operating amplifying means of the plurality of amplifying means.

9. The power amplifier according to claim 8, wherein the DC bias supply circuit for multi frequencies comprises:

a transmission line group having a plurality of bias transmission lines which correspond to signal frequencies corresponding to the plurality of amplifying means and are connected in series with each other, a first bypass capacitor which is connected to one end of a highest-frequency bias transmission line corresponding to the highest signal frequency, which is provided on one end of the transmission line group and has the other end connected to the node, a first sub switch which is connected in series with the first bypass capacitor and is controlled so as to be turned on and off by the control means, at least one second bypass capacitor connected between the plurality of bias transmission lines of the transmission line group, a second sub switch connected in series with the second bypass capacitor, and a bias terminal which is provided on the other end of the transmission line group, is connected to a side not being connected to the other bias transmission lines, and is fed with DC bias supplied from the control means;

and the other end of the highest-frequency bias transmission line is grounded via the first bypass capacitor and the first sub switch, grounding is made between the plurality of bias transmission lines of the transmission line group other than the other end of the highest-frequency bias transmission line via the second bypass capacitor and the second sub switch, the first bypass capacitor is short-circuited at the highest signal frequency of the signal frequencies, and the second bypass capacitor is short-circuited at the signal frequency associated with a sum of lengths of transmission lines from the connecting position to the node.

10. A power amplifier having a multistage constitution, wherein the power amplifier described in any one of claims 1 to 3 is combined and used as an amplifier of at least one stage or more.

11. A power amplifier, wherein all or some parts of the power amplifier described in any one of claims 1 to 3 are configured on the same semiconductor substrate.

12. A power amplifier, wherein all or some parts of the power amplifier described in any one of claims 1 to 3 are configured on a plurality of different semiconductor substrates from each other.

13. A communication apparatus, comprising:

a signal processing circuit, a transmitting circuit which transmits a signal from the signal processing circuit and has a power amplifier, an antenna which transmits an output of the transmitting circuit and receives a reception signal, and a receiving circuit of processing the reception signal, wherein the power amplifier is the power amplifier described in any one of claims 1 to 3.

14. The power amplifier according to claim 1, wherein the amplifying means further comprises:

said DC bias supply circuit provided between the first matching circuit and the transistor and/or between the second matching circuit and the transistor;

and at least one of the first matching circuit and the second matching circuit has variable impedance.

* * * * *